(12) United States Patent
Sakao

(10) Patent No.: US 6,184,584 B1
(45) Date of Patent: Feb. 6, 2001

(54) MINIATURIZED CONTACT IN SEMICONDUCTOR SUBSTRATE AND METHOD FOR FORMING THE SAME

(75) Inventor: Masato Sakao, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/291,872

(22) Filed: Apr. 14, 1999

(30) Foreign Application Priority Data

Apr. 16, 1998 (JP) .................................................. 10-106312

(51) Int. Cl.$^7$ .......................... H01L 23/48; H01L 23/52; H01L 29/40
(52) U.S. Cl. .......................... 257/758; 257/759; 257/520; 257/626; 438/639; 438/672
(58) Field of Search .................................... 257/758, 759, 257/760, 754, 768, 770, 520, 626, 622; 438/639, 637, 634, 657, 672

(56) References Cited

U.S. PATENT DOCUMENTS

| | | | |
|---|---|---|---|
| 5,625,232 | * | 4/1997 | Numata et al. . |
| 5,661,344 | * | 8/1997 | Havemann et al. . |
| 5,710,462 | * | 1/1998 | Mizushima . |
| 5,712,509 | * | 1/1998 | Harada et al. . |
| 5,798,297 | * | 8/1998 | Winnerl et al. . |
| 5,929,524 | * | 7/1999 | Drynan et al. . |
| 5,966,634 | * | 10/1999 | Inohara et al. . |
| 5,977,599 | * | 11/1999 | Adrian . |
| 6,074,943 | * | 6/2000 | Brennan et al. . |
| 6,078,073 | * | 6/2000 | Habu et al. . |

FOREIGN PATENT DOCUMENTS

| | | |
|---|---|---|
| 2-170561 | 7/1990 | (JP) . |
| 9-97880 | 4/1997 | (JP) . |
| 9-129729 | 5/1997 | (JP) . |
| 10-27889 | 1/1998 | (JP) . |

* cited by examiner

Primary Examiner—Sheila V. Clark
(74) Attorney, Agent, or Firm—Hutchins, Wheeler & Dittmar

(57) ABSTRACT

A miniaturized contact in a semiconductor substrate is provided. The contact comprises a diffused layer formed at a surface of the substrate, an interlayer film for covering the diffused layer, a plurality of lower interconnections buried within the interlayer film, an upper interconnection disposed on the interlayer film and a contact hole passing through the interlayer film for connecting the diffused layer with the upper interconnection. The contact hole has an aperture diameter equivalent to a space interval between the lower interconnections. The contact further comprises a first buried conductor disposed only from the bottom of the contact hole to a height lower than that of the lower interconnections, a side-wall insulator disposed on a sidewall of the contact hole above the first buried conductor, and a second buried conductor disposed on the first buried conductor within the contact hole.

10 Claims, 3 Drawing Sheets

MINIATURIZED CONTACT IN SEMICONDUCTOR SUBSTRATE AND METHOD FOR FORMING THE SAME

BACKGROUND OF THE INVENTION

1. Field of the Invention

The present invention relates to a miniaturized contact structure in a semiconductor substrate for connecting an upper interconnection with a diffused layer, and also relates to a method for forming the miniaturized contact.

2. Description of the Related Art

It has been still intensively proceeded to miniaturize each individual semiconductor element that is fabricated in the semiconductor substrate and to obtain a semiconductor device that includes these semiconductor elements integrated in the semiconductor substrate with a high-density. Such the miniaturization and the increase of density can not be achieved with a satisfactory result by only depending on a progress of the minimum feature size of (F) defined by the lithography technology.

If focusing attention on a surface of the semiconductor substrate, for example, the minimum line-width and the minimum space interval of a lower interconnection can be easily formed with (F). If focusing attention on a contact hole for use in connection of the lower interconnection with an upper interconnection formed in an insulator layer covering the semiconductor substrate, the minimum line-width and the minimum space interval of the upper interconnection can also be easily formed with (F).

However, a practicable semiconductor device can not be easily produced by combining such the lower interconnection, contact hole and upper interconnection. The reason why it is not easy may depend on the problems related to the lithography technology. Using freely a plurality of lithography processes and the like may produce the semiconductor device consisting of integrated semiconductor elements. At this stage, setting an alignment margin for aligning a photo mask is required between the lithography processes. Therefore, it is necessary to extend the line-width by the alignment margin at a layer of the lower interconnection at where the contact hole may reach. Thus, a line-pitch of the lower interconnection is necessary to set at (F)×2 or more.

In recent years, it has been possible by adopting the self-aligned contact hole to realize a line-width of (F) in a portion of the lower interconnection at where at least the contact hole reaches. It is also possible to form, within a space interval between the interconnections, an aperture having a contact size (a designed size) equivalent to a line-interval of (F).

A method proposed in IEICE TRANSACTION, Vol. E74, No. 4, pp. 818–826, 1991 will be exemplified below.

FIGS. 1(a)–(e) are cross sectional views showing processes for realizing an aperture for a contact hole by reducing a real contact hole size in the case where a designed line-interval of (F) is equivalent to the designed contact hole size.

In the processes, the contact hole aperture may be realized first by reducing the real contact hole size if the designed line-interval of (F) were equivalent to the designed contact hole size.

This specification describes a case where no space is present between the interconnection and the contact hole for the convenience of understanding the difference between the present invention and the prior art in which the alignment margin is prepared between the interconnection and the contact hole.

As shown in FIG. 1(a), a device isolation 201 and a diffused layer 202 are formed at a surface of a semiconductor substrate not depicted in the figure. A plurality of lower interconnections 203 is also formed on a lower interlayer film 204a deposited over the whole substrate. Then, an upper interlayer film 204b is deposited so as to bury the interconnections 203 as shown in FIG. 1(b). A photo-resist 205 is further deposited on the upper interlayer film 204b and is defined to open a contact hole at a location between the interconnections 203 buried within the upper interlayer film 204b. A contact hole 206 having a size equal to an aperture diameter of the resist is then opened above the diffused layer 202 by dry etching.

After removing the resist, an HTO film (LPCVD High Temperature Oxide Film) 207 is formed over the upper surface of the upper interlayer film 204b as well as on a side-wall and the bottom of the contact hole 206 as shown in FIG. 1(c). After performing a dry etchback for removing the HTO film 207 from the bottom of the contact hole 206, a partial HTO film 207' may remain only on the inner wall of the contact hole 206 as shown in FIG. 1(d).

Further, forming an upper interconnection 208 may finish the contact portion as shown in FIG. 1(e) while this point is not described in the prior art.

As described above, the conventional technique is possible to arrange the lower interconnections and the contact hole with ensuring an insulating property by reducing the contact hole size finally even in a layout where the designed alignment margin is not present between the lower interconnections.

The conventional technique, however, may include the following disadvantages.

The opened bottom of the contact hole 206 shown in FIG. 1(d) accepts the etchings twice according to the conventional technique, resulting extremely many defects within the diffused layer and in the substrate. With respect to the etching itself, the second etching is intended to remove the HTO film at a narrow and deep section by etchback. As the result, a probability of obtaining the desired aperture may be considerably lowered.

If reducing the size of the contact hole 206, an area of a contact region between the contact hole and the diffused layer may be decreased and a resistivity of the contact region may increase inversely proportional to the contact area accordingly. In addition, reducing the size may generate a narrow and deep contact hole along the whole depth direction of the contact (a contact having a large aspect ratio). As the result, a contact resistance may be increased even in this stage (proportional to the contact depth and inversely proportional to the contact area). Further, finishing the contact by filling the contact hole with the interconnection layer may cause very serious problems such as a brake in the interconnection according to the coverage and burying property for the interconnection when obtaining a higher aspect ratio with such the structure.

An object of the present invention is to provide a miniaturized contact structure capable of forming an excellent contact without causing fatal problems in case of forming the contact, such as the increase of contact resistance and the disconnection. This may be achieved even when the contact must be formed under a condition where the alignment margin is not present in such the line-interval space.

Another object of the present invention is to provide a method for forming a miniaturized contact having such the structure.

SUMMARY OF THE INVENTION

The present invention provides a miniaturized contact in a semiconductor substrate. The contact comprises a diffused layer formed at a surface of the semiconductor substrate; an interlayer film for covering the diffused layer; a plurality of lower interconnections buried within the interlayer film; an upper interconnection disposed on the interlayer film; and a contact hole passing through the interlayer film for connecting the diffused layer with the upper interconnection. The contact hole has an aperture diameter equivalent to a space interval between the lower interconnections. The miniaturized contact further comprises a first buried conductor disposed within the contact hole only from the bottom to a height lower than that of the lower interconnections; a side-wall insulator disposed on a side-wall of the contact hole above the first buried conductor; and a second buried conductor disposed on the first buried conductor within the contact hole up to a height sufficient to contact with the upper interconnection.

The first buried conductor preferably includes a polysilicon, a metal silicide and a refractory metal. The second buried conductor preferably includes a polysilicon. Further, a single layer interconnection may be substituted for the second buried conductor.

According to the above structure, determining the designed sizes of the line-interval and the contact hole each equal to the minimum feature size of (F) may minimize the occupied area and may realize an excellent miniaturized contact even with using the minimum feature size.

The present invention also provides a method for forming the above-described miniaturized contact in a semiconductor substrate. The semiconductor substrate includes: a diffused layer formed at a surface of the semiconductor substrate; an interlayer film disposed on the semiconductor substrate for covering the diffused layer; a plurality of lower interconnections disposed within the interlayer film; and an upper interconnection disposed on the interlayer film. The method comprises the steps of:

opening a contact hole passing through the interlayer film for connecting the diffused layer with the upper interconnection, in which the contact hole has an aperture diameter equivalent to a space interval between the lower interconnections;

forming a first conductor for covering the interlayer film, in which the first conductor fills the contact hole;

etchback the first conductor for remaining a part of the first conductor only from the bottom of the contact hole to a height lower than that of the lower interconnections, in which the part of the first conductor forms a first buried conductor;

forming a side-wall insulator on a side-wall of the contact hole above the first buried conductor after forming the first buried conductor;

forming a second conductor for covering the interlayer film, in which the second conductor contacts with the first buried conductor;

etchback the second conductor for remaining a part of the second conductor only within the contact hole, in which the part of the second conductor forms a second buried conductor; and forming an upper interconnection for connecting with the second buried conductor.

According to the present invention, the exposed portion of the diffused layer at the opened contact bottom may only undergo the etching exposure once. Thus, the etched damages to that portion may be reduced when compared to the above-described prior art. Therefore, the introduction of the defects for causing a diffused layer leakage, for example, can be effectively prevented.

BRIEF DESCRIPTION OF THE DRAWINGS

The present invention will be more fully understood from the following detailed description taken in conjunction with the accompanying drawings in which.

DETAILED DESCRIPTION OF THE PREFERRED EMBODIMENTS

Figure 1A:
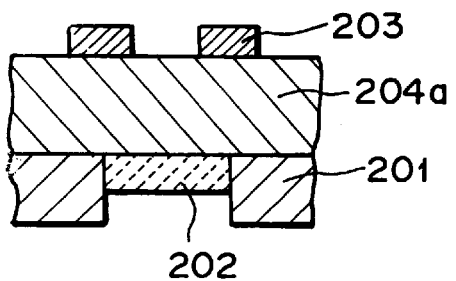
FIGS. 1A–1E are a process diagram showing the conventional method for forming a miniaturized contact in a semiconductor substrate.
Figure 1B:
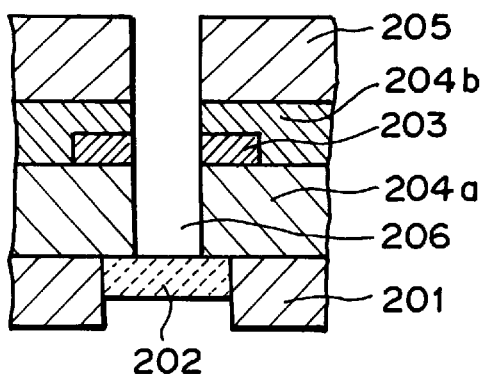
Figure 1C:
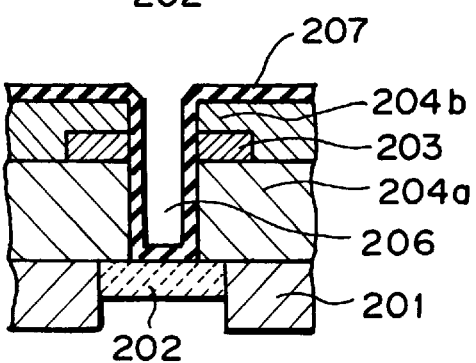
Figure 1D:
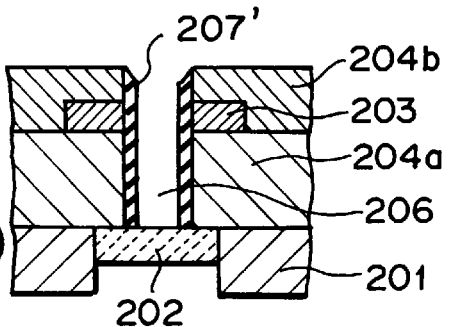
Figure 1E:
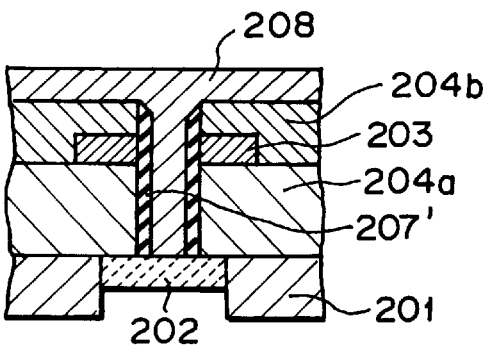
Figure 2A:
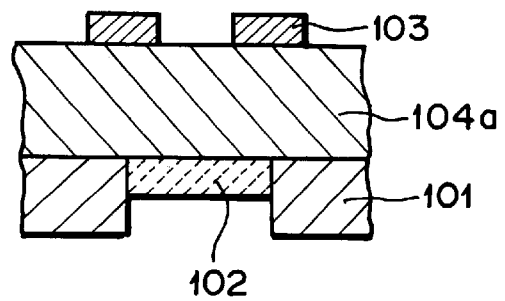
FIGS. 2A–2D are a process diagram showing the first half of processes in a method for forming a miniaturized contact in a semiconductor substrate according to an embodiment of the present invention.
Figure 2B:
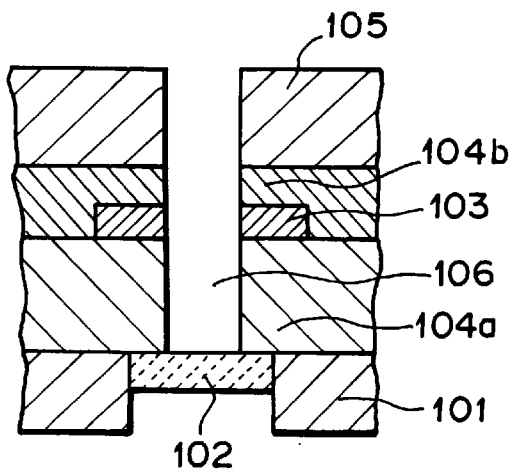
Figure 2C:
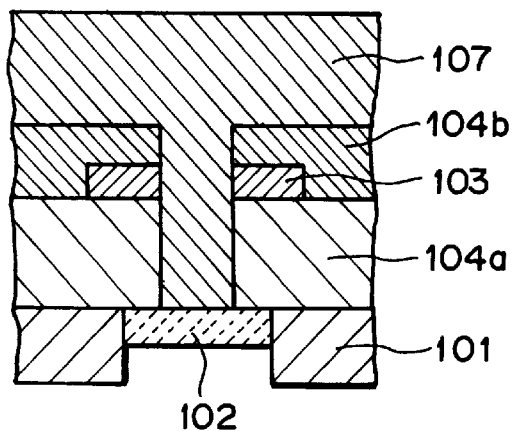
Figure 2D:
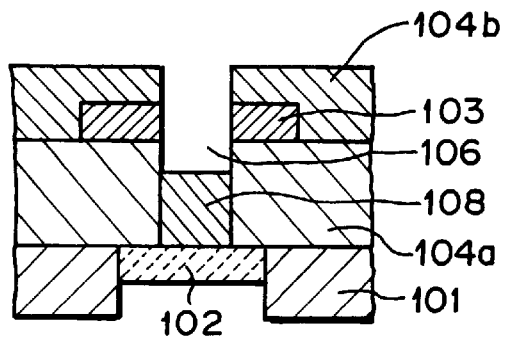
Figure 3A:
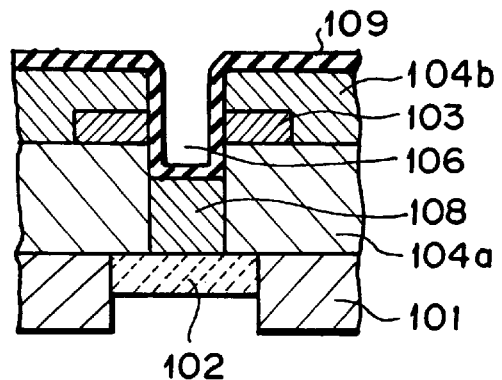
FIGS. 3A–3D are a process diagram showing the second half of the processes in the method according to the embodiment of the present invention.
Figure 3B:
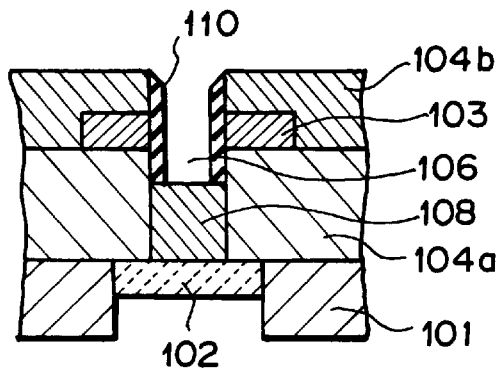
Figure 3C:
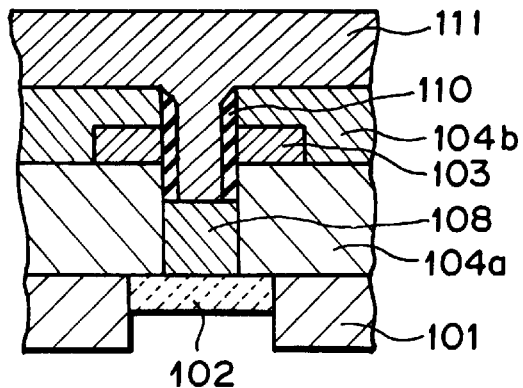
Figure 3D:
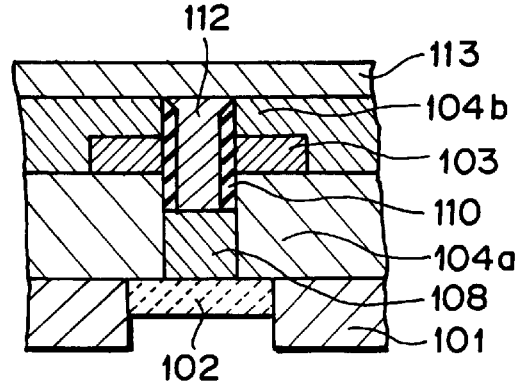

A method for forming a miniaturized contact according to an embodiment of the present invention will be described with reference to FIGS. 2 and 3. Processes shown in FIGS. 2 and 3 are preformed sequentially.

As shown in FIG. 2(*a*), a device isolation 101 and a diffused layer 102 are formed at a surface of a semiconductor substrate not depicted in the figure. On the substrate, forming a BPSG or non-doped oxide by, for example, CVD method for the use of a lower interlayer film 104*a*.

Next, forming a metal silicide such as WSi and TSi or a refractory metal such as W by a PVD or CVD method, and then defining a plurality of lower interconnections 103 with using the general lithograph technique and dry etching technique. The interconnections have an interval space of the minimum feature size therebetween that is determined from the resolution limit of the lithography.

Thereafter, depositing again a BPSG or non-doped oxide over the whole area including the interconnections 103 and the lower interlayer film 104*a* to form an upper interlayer film 104*b* as shown in FIG. 2(*b*). A planarization process may be adapted for removing the roughness that reflects the steps of the interconnections 103 from the upper interlayer film 104*b*. This is useful from a viewpoint of simplifying the later exposing process. The planarization process may include a heating step to reflow the interlayer films in a nitrogen atmosphere in case of BPSG and may include an etchback process in case of the non-doped oxide after adapting CMP (Chemical Mechanical Polishing) or coating SOG (Spin On Glass). At this stage, patterning a photo resist 105 to become a mask for use in the etching of a contact hole with using the general lithography technique. Then, performing the normal anisotropic dry etching to open a contact hole 106.

Then, forming an impurity-doped polysilicon film as a first conductor 107, for example, as shown in FIG. 2(*c*). This film formation is performed so as to realize a film thickness sufficient to fill the entire contact hole 106 and moreover prevent a recess that reflects the recess of the contact hole, from appearing on the upper surface of the polysilicon.

Thereafter, etchback the polysilicon under an isotropic condition so that a part of the polysilicon may remain within the contact hole 106 only beneath the bottom plane of the lower interconnections 103 in order to form a first buried conductor 108 as shown in FIG. 2(*d*). Planarization technique, that is adapted to the surface of the polysilicon for preventing the recess from appearing near the upper portion of the contact hole as described in FIG. 2(*c*), is similarly important in the case shown in FIG. 2(*d*). Because the recess may also appear at the surface of the first buried conductor 108 in general and may reach at the diffused layer 102 in the worst case in FIG. 2(*d*).

Further, growing a silicon oxide or silicon nitride deposited on the side-wall and the bottom inside the contact hole 106 so as to exhibit a good coverage, resulting an insulator 109 as shown in FIG. 3(*a*). Thereafter, etchback the insulator 109 under an anisotropic condition to remain a side-wall insulator 110 only on the side-wall of the contact hole as shown in FIG. 3(*b*). It is important to arrange the side-wall insulator 110 so as to cover at least side portions of the lower interconnections 103.

Next, forming a doped polysilicon so as to fill the contact hole 106 to realize a second conductor 111 as shown in FIG. 3(*c*). Then, etchback the polysilicon in isotropic to form a second buried conductor 112 as shown in FIG. 3(*d*).

If the first and second buried conductors 108 and 112 were doped polysilicon, an annealing process is required for activating the impurity. Either the annealing process using an electric furnace at a relatively low temperature or the annealing process using a lamp annealer at a relatively high temperature for a rapid annealing; for example, at 1000° C. and for 60 seconds may achieve a desired effect. The annealing process using the lamp annealer is more preferable to control the diffusion of the impurity in the diffused layer formed in the substrate to increase a ratio of the activated impurity within the polysilicon.

Then, forming an upper interconnection 113 by using a metal mainly including aluminum or a metal silicide such as WSi.

Thus formed miniaturized contact may have the structure as shown in FIG. 3(*d*). The structure is realized by forming the contact hole having an aperture diameter equivalent to the line-interval between the lower interconnections, filling the first buried conductor 108 from the bottom to a height beneath the lower interconnections, providing the side-wall insulator on the side-wall at the opened portion above the first buried conductor 108 for preventing mainly the lower interconnections 103 from contacting with the side portion of the contact hole, filling the second buried conductor 112, and forming the upper interconnection 113 so as to connect with the second buried conductor.

The portion that is called the upper interconnection in FIGS. 2 and 3 may also be employed as a lower electrode of a static capacitor in a DRAM memory cell. Adapting such the contact structure to the DRAM cell may be effective to reduce a cell size of the memory cell.

The second buried conductor is buried in the upper portion of the contact hole in the above embodiment. According to another embodiment of the present invention, a single layer interconnection may be formed within the contact hole having the side-wall insulator, if the coverage thereof may be allowable, instead of the second buried conductor. In this case, the second buried conductor may also be a laminated film consisting of polysilicon and WSi, and may further be a metalization mainly consisting of aluminum. A laminated barrier film consisting of Ti and TiN may be disposed beneath the metalization. A single layer W film and a multi-layered W film containing the barrier may be used as the metalization. In the structure having such the second buried conductor, the etchback process and the like can be omitted. Thus, decreasing the number of the processes, reducing the cost, and lowering the resistivity can be realized.

In a further embodiment of the present invention viewed from a point of lowering the resistivity, the first buried conductor may be a metal silicide such as WSi rather than polysilicon. To further lower the resistivity effectively, the first buried conductor may be a refractory metal such as W. In the case of W, it is necessary to prevent an encroachment from occurring in the diffused layer during the W film formation. Therefore, the first buried conductor can be produced industrially by forming a Ti film on the bottom of the contact hole, then annealing in a nitrogen-containing atmosphere to form $TiSi_2$ (Ti silicide), next etching to remove an excess Ti with a reagent liquid such as an APM after the silicification, thereafter forming a W film, and dry etching.

As described above, according to the present invention, the exposed portion of the diffused layer at the opened contact bottom may only undergo the etching exposure once. Thus, the etched damages to that portion may be reduced when compared to the above-described prior art.

The contact portion and contact area between the contact hole and the diffused layer may not be reduced. Thus, opening the contact with the designed minimum feature size, preventing the resistivity from increasing due to the reduction of the contact portion area, and employing the bottom area of the contact effectively can be achieved. In addition, the insulating property of the contact between the lower interconnections and the contact hole can be ensured in a self-aligned manner by providing the side-wall insulator.

Further, the reduction of the contact size may not be performed at a portion beneath the bottom of the lower interconnections. Thus, the resistivity of that portion may not be increased, and the contact resistance may be lowered, when compared to that in the case where the contact hole size is reduced along the whole depth direction.

In addition, the lack of the coverage of the upper interconnection may not affect directly to the contact resistance and the yield of the open defect when compared to the case where the contact size is reduced with forming the side-wall insulator along the whole depth direction. This is because that the reduced portion is limited in the upper portion of the contact and that the first buried conductor has been already filled into the lower portion beneath the upper potion. This may avoid the filling of the high aspect ratio contact when forming the second buried conductor and the upper interconnection. The resistivity may be further reduced with employing the refractory metal as the first or second buried conductor rather than the buried polysilicon. Filling two different materials into the contact may increase the selection freely in accordance with each filling depth, filling property and coverage of the materials, and the setting of desired resistance.

Having described preferred embodiments of the invention it will now become apparent to those of ordinary skill in the art that other embodiments incorporated these concepts may be used. Accordingly, it is submitted that the invention should not be limited to the described embodiments but rather should be limited only by the spirit and scope of the appended claims.

What is claimed is:

1. A miniaturized contact in a semiconductor substrate, comprising:
   a diffused layer formed at a surface of said semiconductor substrate;
   an interlayer film for covering said diffused layer;
   a plurality of lower interconnections buried within said interlayer film;
   an upper interconnection disposed on said interlayer film;
   a contact hole passing through said interlayer film for connecting said diffused layer with said upper interconnection, said contact hole having an aperture diameter equivalent to a space interval between said lower interconnections;

a first buried conductor disposed within said contact hole only from the bottom to a height lower than that of said lower interconnections;

a side-wall insulator disposed on a side-wall of said contact hole above said first buried conductor; and a second buried conductor disposed on said first buried conductor within said contact hole up to a height sufficient to contact with said upper interconnection.

2. A miniaturized contact in a semiconductor substrate according to claim 1, wherein said first buried conductor consists of a polysilicon.

3. A miniaturized contact in a semiconductor substrate according to claim 1, wherein said first buried conductor consists of one of a metal silicide and a refractory metal.

4. A miniaturized contact in a semiconductor substrate according to claim 1, wherein said second buried conductor consists of a polysilicon.

5. A miniaturized contact in a semiconductor substrate according to claim 1, further comprising a single layer interconnection, said single layer interconnection being substituted for said second buried conductor.

6. A method for forming a miniaturized contact in a semiconductor substrate, said substrate including:

a diffused layer formed at a surface of said semiconductor substrate;

an interlayer film disposed on said semiconductor substrate for covering said diffused layer;

a plurality of lower interconnections buried within said interlayer film; and an upper interconnection disposed on said interlayer film, wherein said method comprising the steps of:

opening a contact hole passing through said interlayer film for connecting said diffused layer with said upper interconnection, said contact hole having an aperture diameter equivalent to a space interval between said lower interconnections;

forming a first conductor for covering said interlayer film, said first conductor filling said contact hole;

etchback said first conductor for remaining a part of said first conductor only from the bottom of said contact hole to a height lower than that of said lower interconnections, said part of said first conductor forming a first buried conductor;

forming a side-wall insulator on a side-wall of said contact hole above said first buried conductor after forming said first buried conductor;

forming a second conductor for covering said interlayer film, said second conductor contacting with said first buried conductor;

etchback said second conductor for remaining a part of said second conductor only within said contact hole, said part of said second conductor forming a second buried conductor; and forming an upper interconnection for connecting with said second buried conductor.

7. A method according to claim 6, wherein said first buried conductor consists of a polysilicon.

8. A method according to claim 6, wherein said first buried conductor consists of a metal silicide or a refractory metal.

9. A method according to claims 6, wherein said second buried conductor consists of a polysilicon.

10. A method according to claim 6, said substrate further including a single layer interconnection, said single layer interconnection being substituted for said second buried conductor.

* * * * *